United States Patent [19]
Lee

[11] Patent Number: 5,589,764
[45] Date of Patent: *Dec. 31, 1996

[54] METER FOR MEASURING ACCUMULATED POWER CONSUMPTION OF AN ELECTRICAL APPLIANCE DURING OPERATION OF THE APPLIANCE

[76] Inventor: Graham S. Lee, 760 Fairmile Rd., West Vancouver, British Columbia, Canada

[*] Notice: The term of this patent shall not extend beyond the expiration date of Pat. No. 5,315,236.

[21] Appl. No.: 320,409

[22] Filed: Oct. 3, 1994

Related U.S. Application Data

[63] Continuation-in-part of Ser. No. 196,556, Feb. 15, 1994, which is a continuation of Ser. No. 664,888, Mar. 5, 1991, Pat. No. 5,315,236.

[51] Int. Cl.⁶ .......................... G01R 22/00; G01R 21/00; G07C 1/00
[52] U.S. Cl. .......................... 324/157; 324/116; 324/142; 364/483; 377/20
[58] Field of Search .................. 324/103 R, 113, 324/114, 115, 116, 142, 149, 156, 157; 364/143, 464.04, 483; 377/15, 16, 20; 368/10, 12, 107, 121

[56] References Cited

U.S. PATENT DOCUMENTS

| | | | |
|---|---|---|---|
| 1,704,520 | 3/1929 | Sommer | 324/103 R |
| 4,253,151 | 2/1981 | Bouve | 324/116 X |
| 4,262,842 | 4/1981 | Grover, Jr. et al. | 368/10 X |
| 4,639,876 | 1/1987 | Deeds | 364/483 |
| 4,652,139 | 3/1987 | Sulcer, Jr. | 368/107 X |
| 4,920,549 | 4/1990 | Dinovo | 377/16 |
| 4,924,404 | 5/1990 | Reinke, Jr. | 364/464.04 |
| 5,315,236 | 5/1994 | Lee | 324/149 X |

FOREIGN PATENT DOCUMENTS

| | | |
|---|---|---|
| 2738853 | 3/1979 | Germany . |
| 3033095A1 | 4/1982 | Germany . |

Primary Examiner—Gerard R. Strecker
Attorney, Agent, or Firm—John Russell Uren

[57] ABSTRACT

A power meter (10) is provided which can plug into an electric wall socket and it is provided with its own socket (16) for receiving the plug of an electrical appliance. The power meter has means for measuring electric current flow to an electrical appliance and indicates the amount of electrical power consumed by an appliance. In alternative embodiments, the meter is provided as an integral part of an electric wall switch (30) or wall socket (40) or it is built into an electrical appliance (50). In another embodiment, the power meter has a plurality of sockets for receiving the plugs of a number of electrical appliances for separately indicating the power consumption of each appliance.

8 Claims, 8 Drawing Sheets

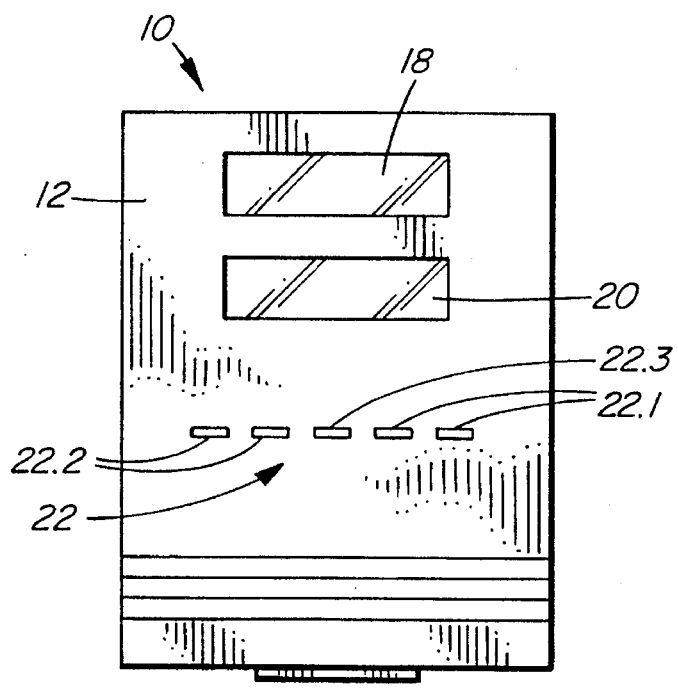
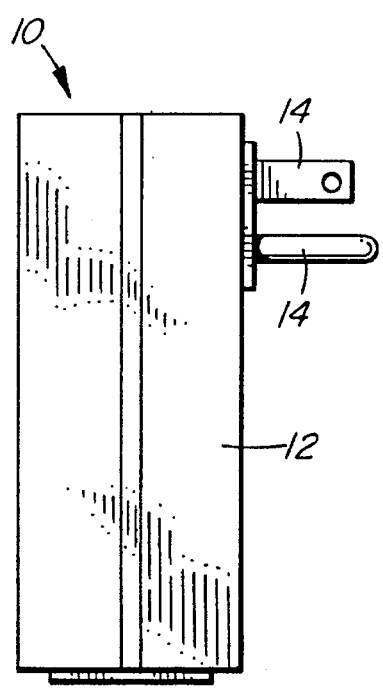
FIG. 1A        FIG. 1B
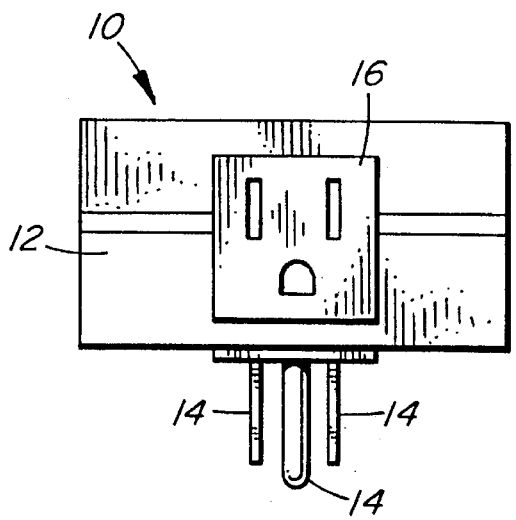
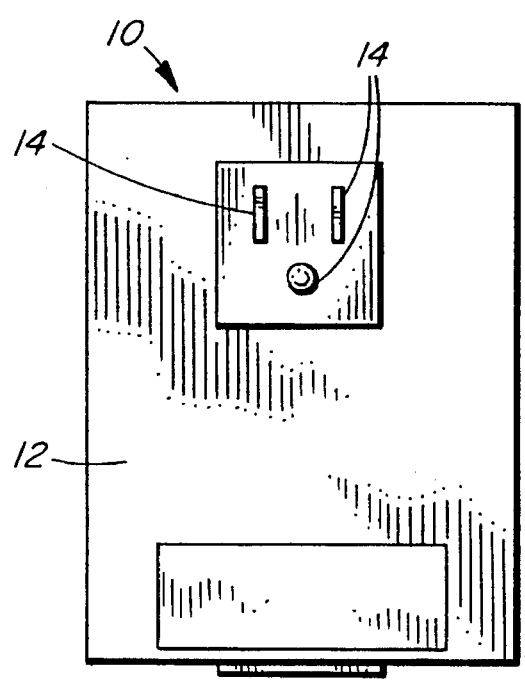
FIG. 1C        FIG. 1D

METER FOR MEASURING ACCUMULATED POWER CONSUMPTION OF AN ELECTRICAL APPLIANCE DURING OPERATION OF THE APPLIANCE

CROSS REFERENCE TO RELATED APPLICATIONS

This application is a continuation-in-part of pending U.S. application Ser. No. 08/196,556 filed Feb. 15, 1994 which, in turn, is a continuation of U.S. application Ser. No. 07/664,888 filed Mar. 5, 1991, now issued as U.S. Pat. No. 5,315,236 and dated May 24, 1994.

FIELD OF THE INVENTION

This invention relates to a meter for measuring power consumption of an electrical appliance.

BACKGROUND OF THE INVENTION

Electrical appliances differ widely with respect to the amounts of electricity which they consume, which, in turn, determines the cost of running the appliances. However, in most cases, the amount of electricity consumed by an appliance is not readily apparent to a consumer. It would be useful if a consumer had means at his disposal by which electric power consumption could be measured, in which case a consumer could take steps to use higher power consumption devices more sparingly in order to save costs. This would result in a general saving of energy, which is in the public interest.

It is accordingly an object of the present invention to provide a power meter which readily provides a consumer with data regarding the power consumption of an electrical appliance.

SUMMARY OF THE INVENTION

According to the invention, there is provided an electric power meter, comprising a body member; prongs on the body member for insertion into an electric wall socket; a socket on the body member for receiving the plug of an electric appliance, said socket being in electrical communication with the prongs for transferring electric power from the prongs to said socket; current measuring means in the body member for measuring electric current flow between said prongs and said socket on the body member; and timing means for measuring the duration of said electric current flow.

Also according to the invention, there is provided an electric wall switch assembly, comprising a wall plate for mounting on a wall; an electric switch on the plate; means for connecting the switch in series with an electric conductor for controlling the flow of electric current through the conductor; current measuring means for measuring electric current flowing across the switch; and timing means for measuring the duration of said electric current flow.

Further according to the invention, there is provided an electric wall plug assembly, comprising a wall plate for mounting on a wall; a socket on the plate for connection to an electric power supply, said socket being adapted to receive the plug of an electric appliance; current measuring means for measuring electric current flow through the socket; and timing means for measuring the duration of electric current flow through the socket.

According to a further aspect of the invention, there is provided an electric power meter comprising a body member, a first display on said body member to display the cost per unit of electric power to be measured by said power meter, a second display on said body member to display the total cost of power consumed by an appliance operably connected to said power meter and an adjuster to change the cost per unit of electric power in said first display.

According to yet a further aspect of the invention, there is provided an electric power meter comprising a body member, a first display on said body member to display the total power consumed by an appliance operably connected to said power meter over a predetermined period of time and a reset to reset said first display to zero when it is desired to commence the recordation of said power consumed.

Further objects and advantages of the invention will become apparent from the description of preferred embodiments of the invention below.

DESCRIPTION OF THE DRAWINGS

FIGS. 1A to D are front, side, top and rear views of a power meter according to one embodiment of the invention;

DETAILED DESCRIPTION OF PREFERRED EMBODIMENTS

Figure 2:
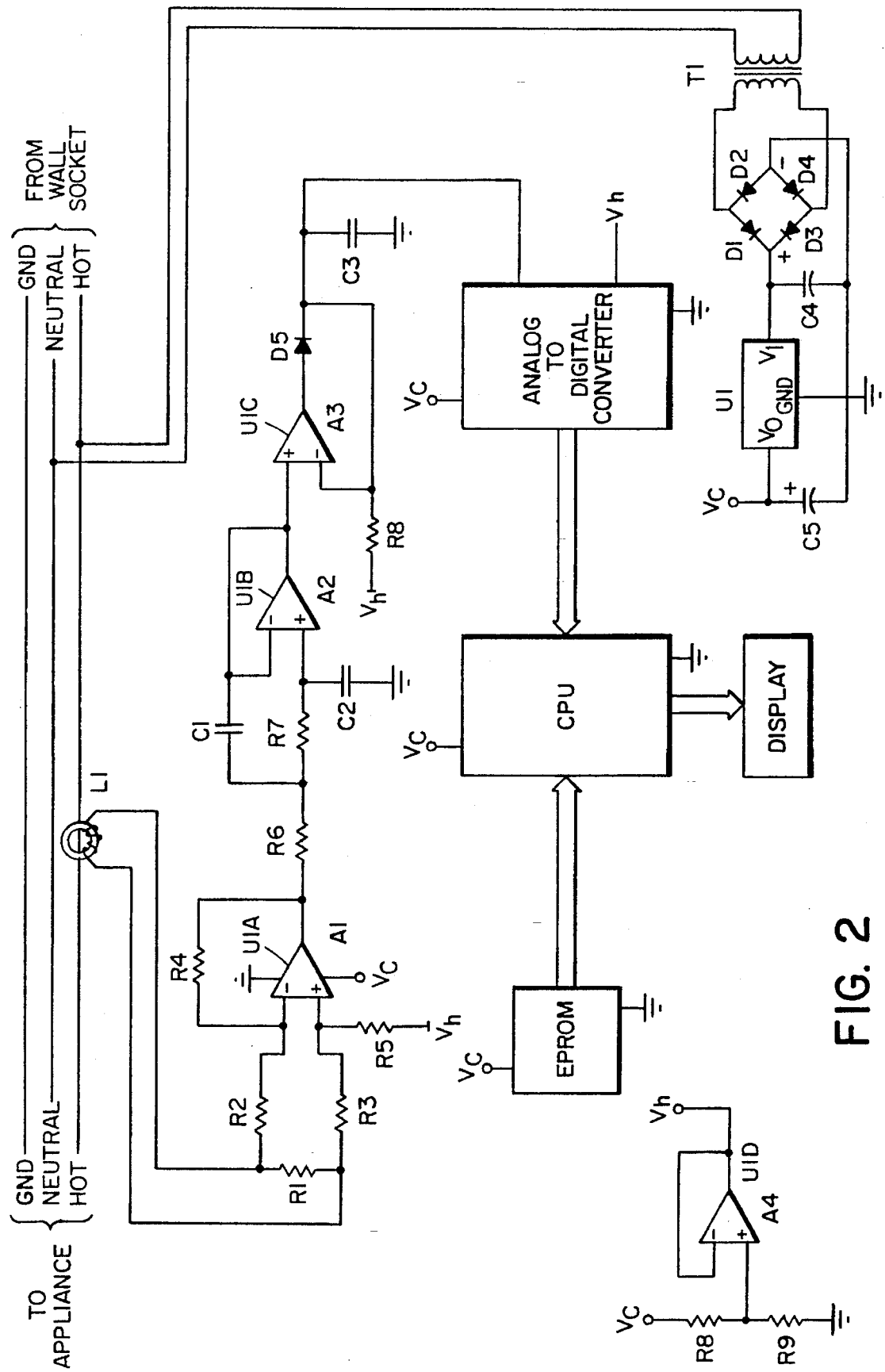
FIG. 2 is a schematical illustration of the electrical circuit of the power meter of FIG. 1.

With reference to FIGS. 1A to 1D, reference numeral 10 generally indicates a power meter comprising a body member 12 provided with prongs 14 on its rear side for insertion into an electric wall socket (not shown). An electric socket 16 is provided on the top of the body member for receiving the electric plug of an electrical appliance (not shown).

The power meter 10 is further provided with two displays on the front of the body member 12. The first display 18 indicates cumulative electric power consumption and the second display 20 indicates the time period over which the electric power has been consumed.

The power meter 10 further includes a power bar 22 which comprises a row of five LED's. The two LED's on the right hand side, indicated by reference numeral 22.1 are red, the two LED's 22.2 on the left hand side are green, and the LED 22.3 in the centre, is white. The purpose of the power bar 22 is to indicate when a high or a low power consumption device is connected, by either lighting up the red or the green LED's. In an intermediate condition, the central white LED is lit up. The power bar 22 therefore gives a qualitative indication of power consumption. Thus, when very high power consumption appliances are connected, the rightmost red LED 22.2 will be lit up and in less severe conditions, the next LED 22.2 will be lit up. On the other extreme, when very light power consumption appliances are connected, the leftmost LED 22.1 will be lit up and then the next LED 22.1, as the case may be. Alternatively, the operation of the power bar 22 may be cumulative, e.g. if an electrical device is of intermediate power usage, both the green LED's 22.2 and the white LED 22.3 may light up.

The working of the power meter 10 will now be described with reference to FIG. 2.

To determine the amount of power consumed by an appliance, the power meter 10 makes use of the fact that an alternating current in a wire generates a proportional magnetic field, and vice versa. Since the line voltage is known for the application at a particular location, the power may be calculated from the amount of current supplied to the appliance.

Referring to the schematic in FIG. 2, L1 is a coil which is wound around a toroid. The conductor for the live connection of the appliance passes through the centre of the toroid. An alternating current passing through the live conductor will create a proportional magnetic field in the toroid, which will in turn induce a proportional alternating current through L1. This current provides an alternating signal across resistor R1. The voltage is then amplified with reference to Vh which is half the supply voltage Vc. Reference voltage Vh is formed by the resistors R8 and R9, and is buffered by the operational amplifier A4. The high gain differential amplifier is composed of operational amplifier A1 and resistors R2, R3, R4 and R5. After amplification, the signal is put through a low pass filter to eliminate any transients. The low pass filter is made up of operational amplifier A2, resistors R6, R7 and capacitors C1 and C2. The final step in processing the signal is performed by operational amplifier A3 which in conjunction with diode D5, resistor R8 and capacitor C3 rectify the alternating signal with reference to voltage Vh. The capacitor C3 is used to hold a DC level which is equal to the peak AC level. This DC voltage level is input to an analog to digital converter which provides a digital representation of the analog voltage to the processor.

The CPU along with its EPROM provide the computational ability for the system, calculating the power consumption based on the digital value provided by the analog to digital converter. This information is then sent to the display as watt-hours consumed. The processor also uses an internal clock to keep track of the amount of time that the appliance has been plugged in, and this is also sent to the display.

The DC power to run the electronics is derived from the AC lines. As seen in the schematic, the power transformer T1 is used to step down the line voltage. This is then rectified and filtered by diodes D1, D2, D3 and D4 and capacitor C4. Voltage regulator U1 provides a regulated output Vc, which is filtered by capacitor C5 and supplied to the electronics.

Figure 3:
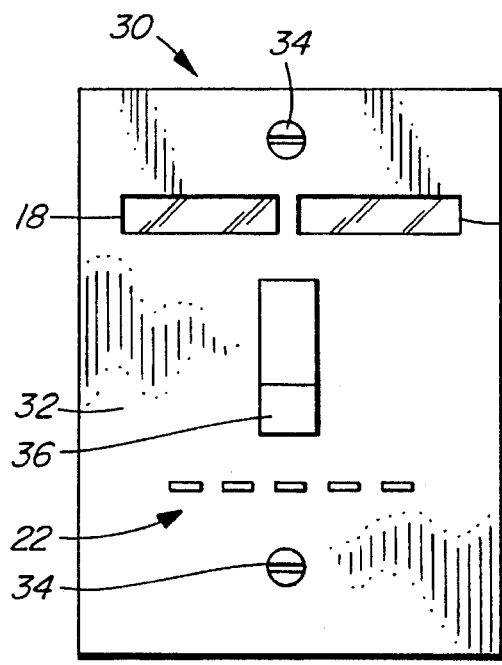
FIG. 3 is a front view of a power meter according to another embodiment of the invention.
Figure 4:
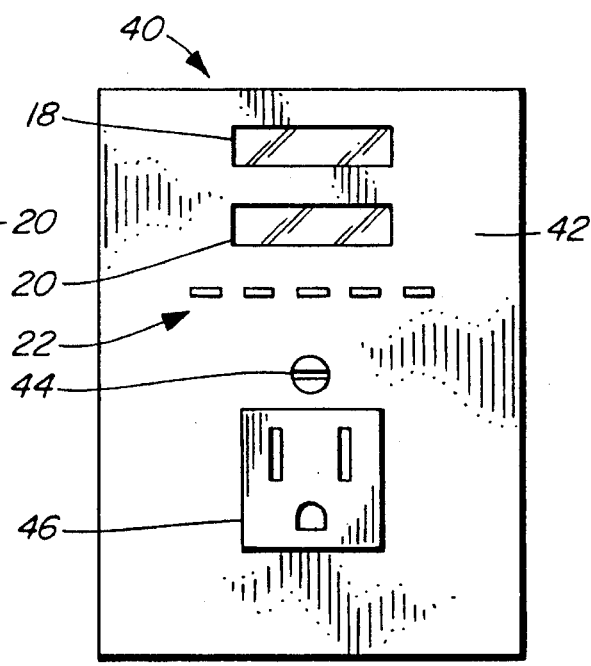
FIG. 4 is a front view of a power meter according to yet another embodiment of the invention.

With reference to FIGS. 3 and 4, two alternative embodiments, generally indicated by reference numerals 30 and 40 respectively, are shown. The power meters 30 and 40 operate in a fashion similar to that of power meter 10. However, the power meter 30 is in the form of a wall switch. It comprises a plate 32 for mounting on the wall by means of screws 34 and it includes a manually operated switch 36 for switching electric current supply on or off. As is the case with the power meter 10, the power meter 30 also has displays 18, for displaying cumulative electric power consumption and indicator 20 for indicating the time period during which the electric power has been consumed. It also has a power bar 22. The electric current flowing through the switch 36 is measured as described with reference to FIG. 2. The wall plate 32 may be provided with more than one switch 36.

With reference to FIG. 4, the power meter 40 is in the form of an electric wall socket. It comprises a plate 42 for mounting on a wall by means of a screw 44 and it has a electric socket 46 for receiving the plug of an electric appliance. It also includes a first display 18, for indicating power consumption, and a second display 20, for indicating time duration, as well as a power bar 22. The electric current flowing through the socket 46 when a plug is inserted is measured as described with reference to FIG. 2. The wall plate 42 may be provided with more than one socket 46.

Figure 5:
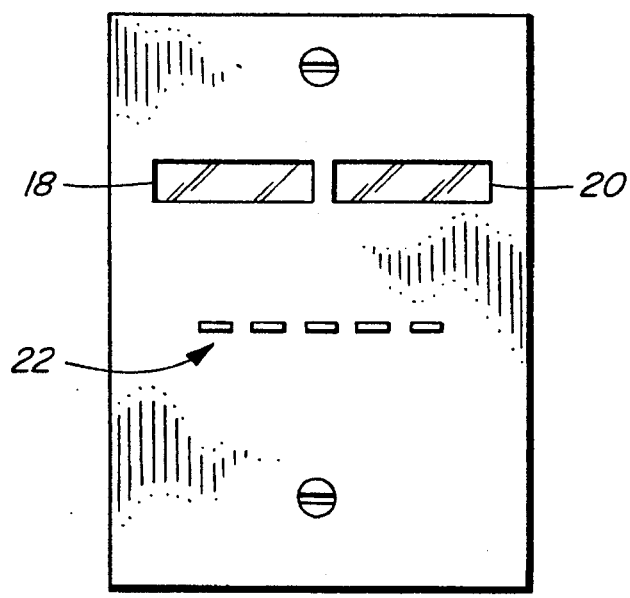
FIG. 5 is a front view of a power meter according to another embodiment of the invention.

Instead of being built into a wall switch or plug, as in FIGS. 3 and 4, respectively, the power meter can be provided as a unit on its own, a shown in the embodiment of FIG. 5.

In this case, the power meter can be installed next to a wall switch or wall socket, e.g. if componentry is too large to fit into an existing wall switch or socket.

Figure 6:
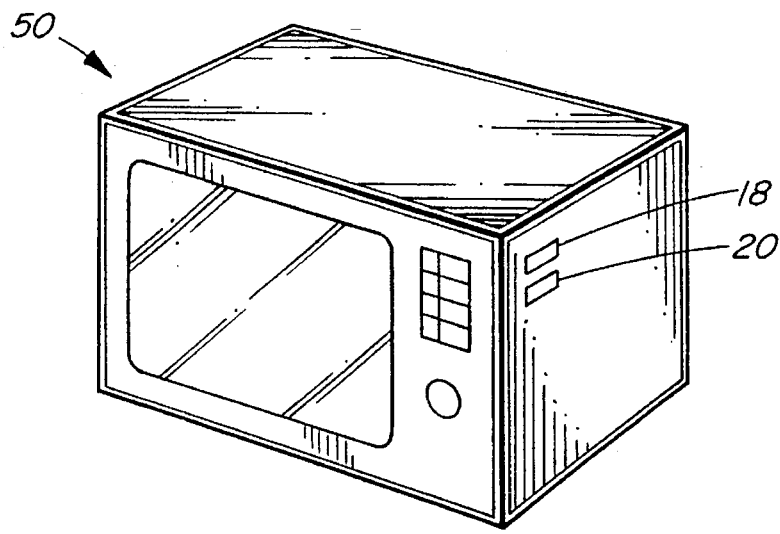
FIG. 6 is an isometric view of an electrical appliance incorporating a power meter according to the invention.

With reference to FIG. 6, a further embodiment of the invention is shown. In this embodiment, the power meter is built into an appliance, such as a microwave oven 50 in the present example. The first and second displays 18 and 20 are provided on the body of the microwave oven 50 and display the electrical power consumption and time duration. The appliance may be any other electrically powered device such as a clock radio, electric lawn mower or dishwasher.

Figure 7:
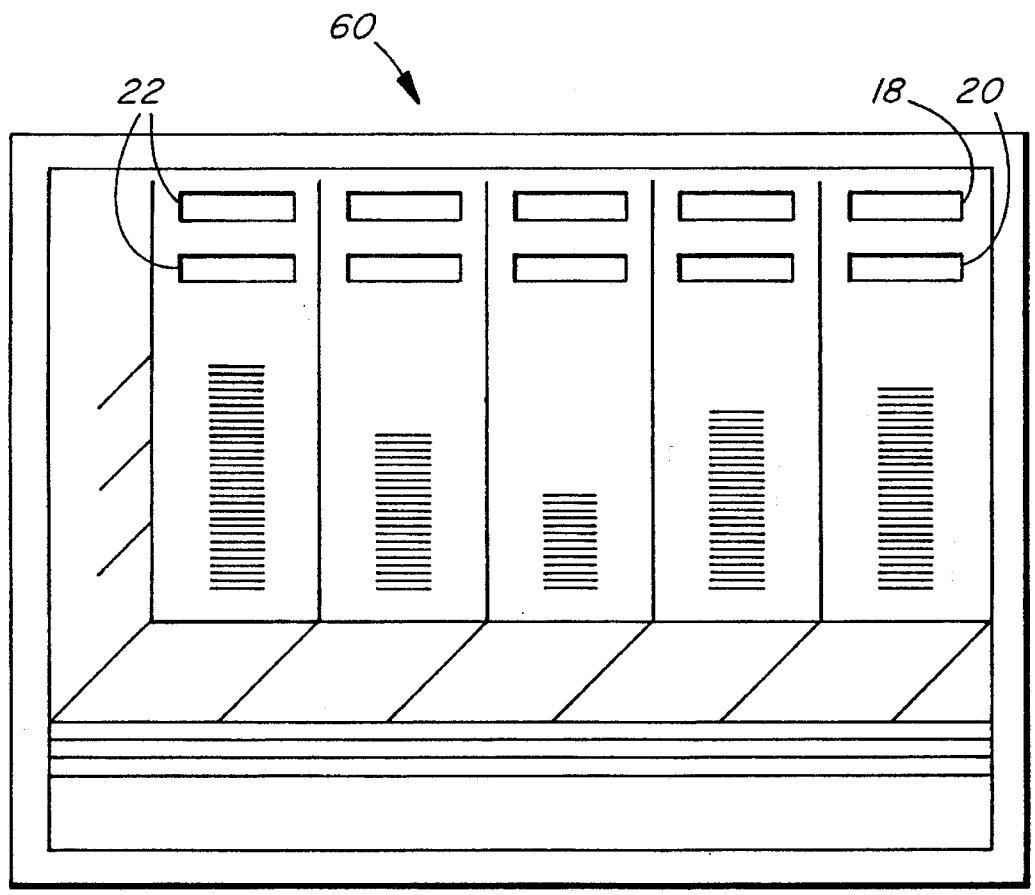
FIG. 7 is a front view of a power meter according to yet a further embodiment of the invention.

With reference to FIG. 7, a further embodiment is shown which comprises a panel 60 having separate displays 18 and 20 for different electrical appliances, such as an electric furnace, hot water heater, etc. Thus, the electric consumption of a variety of different appliances can be measured. The panel 60 may, for example, be connected up to a household fuse box to indicate the power consumption of different electrical appliances associated with the different fuses in the fuse box. It is also contemplated that the panel 60 could be operated by sending signals along the existing electrical wiring from wall plugs, etc. being monitored, to the panel 60 for computation and display.

Figure 8A:
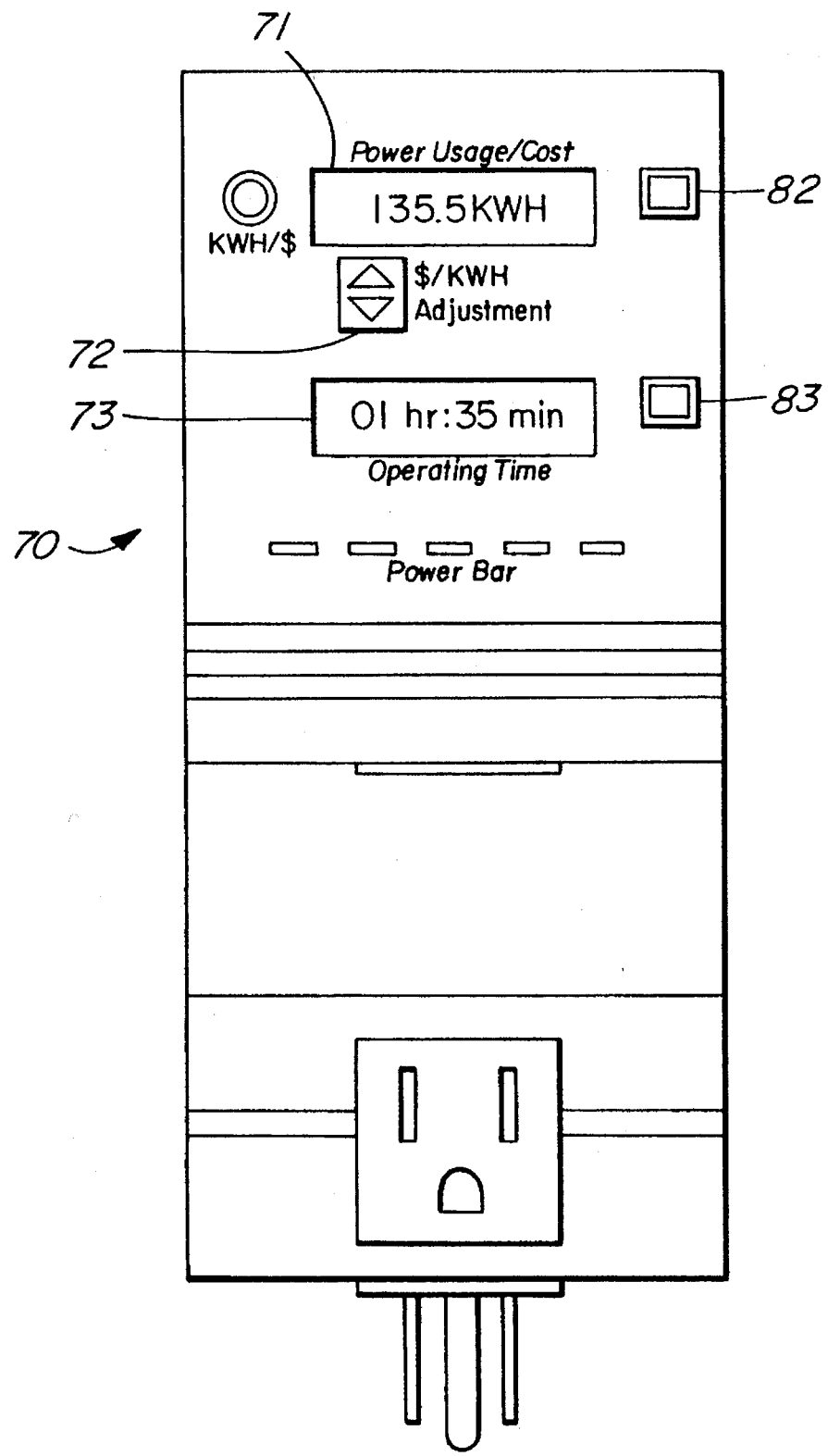
FIGS. 8A, 8B and 8C are front views of the power meter according to yet a further aspect of the invention.
Figure 8B:
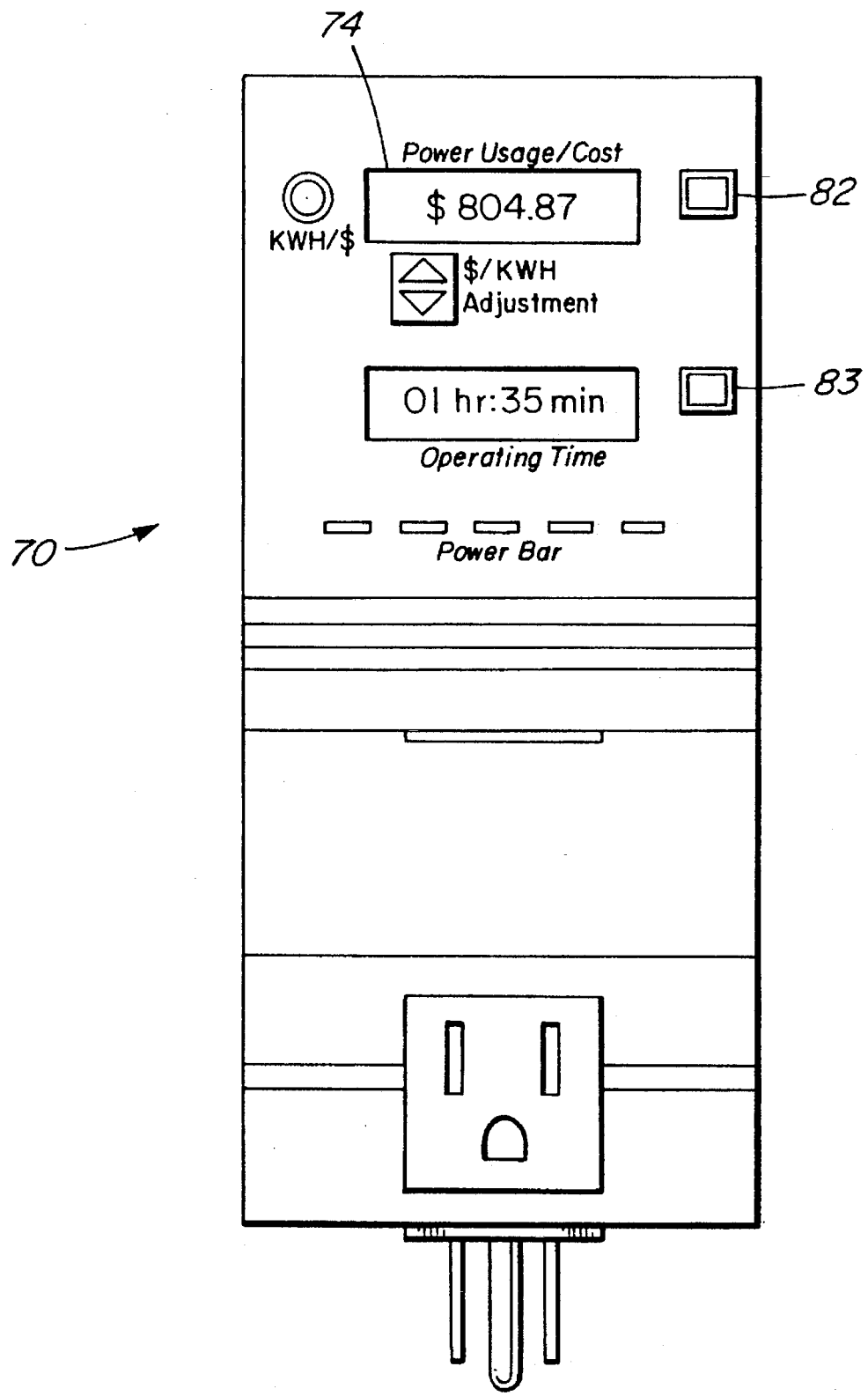
Figure 8C:
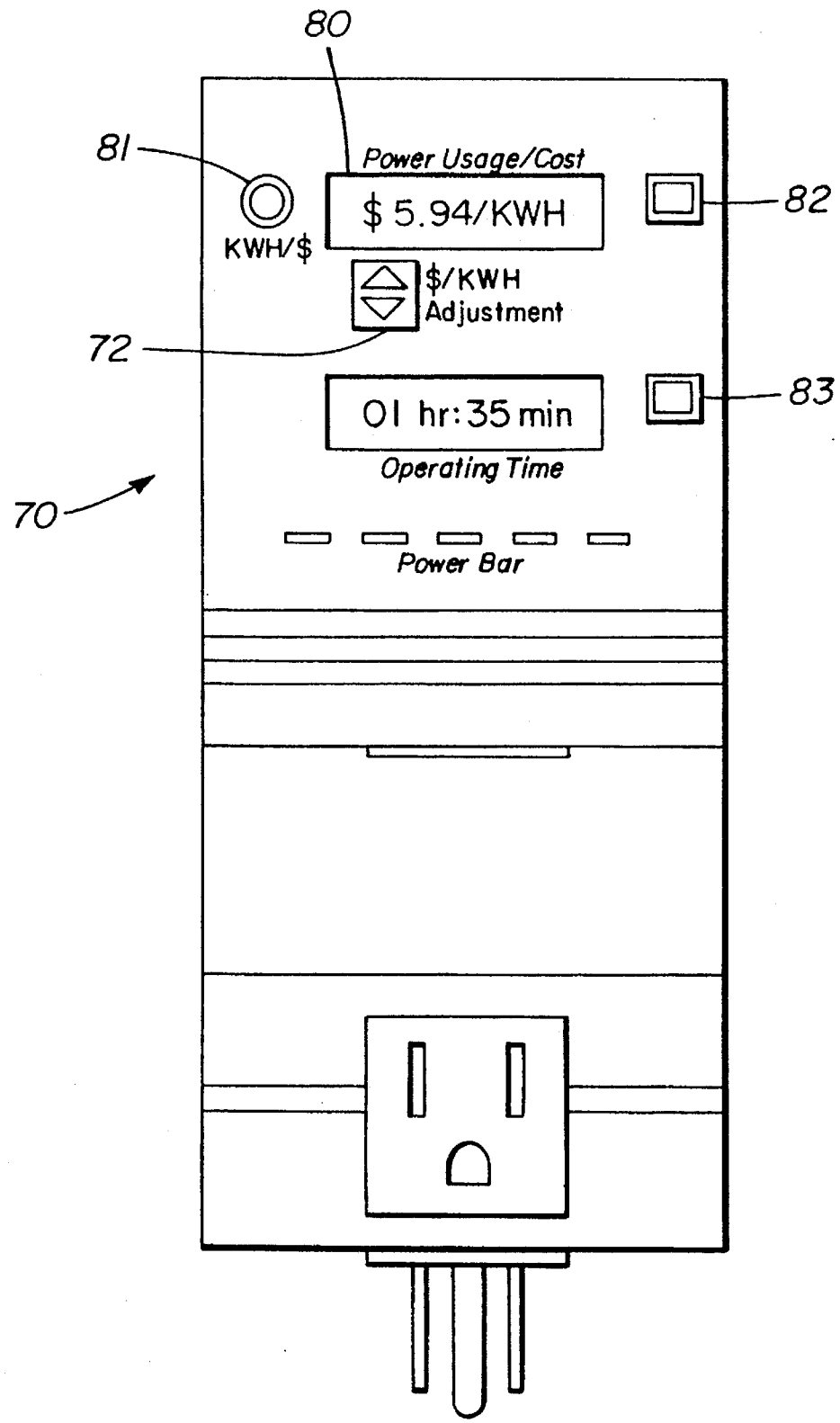

A further aspect of the invention is illustrated in FIGS. 8A, 8B and 8C which illustrate a power costing embodiment which may be conveniently used with the power meter according to the invention generally shown at 70.

The power meter 70 illustrated in FIG. 8A includes a power consumption display 71 and an adjustment panel 72 which will be described in greater detail hereafter. The power meter 70 further includes an operating time display 73 as will also be further described.

The power consumption display 71 is used to display the total power used by the appliance to which the meter 70 is connected. This is illustrated in FIG. 8A. Alternatively, the total cost of the power used as illustrated at 74 in FIG. 8B could be displayed. Finally, the dollar cost per unit of power as illustrated at 80 in FIG. 8C could be displayed. Each of the three functions may be viewed individually by the intermittent pressing of push button 81 which selects the desired display.

For example, it will be assumed that the cost per unit of electricity is known and that such valve is different from the cost per unit of electricity illustrated in FIG. 8C, namely $5.94/KWH. Push button 81 is pressed until it brings up the cost per unit electricity 80 and displayed in FIG. 8C. Thereafter, the power adjustment panel 72 is operated upwardly or downwardly according to the arrows until the proper cost per unit power appears in display 80. This is the basis for initiating operation of the total power usage as displayed in FIG. 8A or the total power cost as viewed in FIG. 8B. Reset push buttons 82, 83 are utilized to reset to zero the display of cost 74 or the display of total power used 71, respectively.

In operation, the correct power cost per unit of electricity is selected in display 80 (FIG. 8C) and push button 81 is operated until the total power usage 71 (FIG. 8A) or total power cost 74 (FIG. 8B) is displayed as desired by the operator. Push button 82 is then depressed which zeros display 74 or 80 and operation of the power meter 70 is commenced, the total power usage 71 or the total power costs 74 being displayed as desired. Likewise, the time display 73 is returned to zero by pressing push button 83. Display 73 shows the period of time over which the power cost or power use has been measured. It is contemplated that the costing calculations and display could be likewise conveniently used with the other embodiments of the power meter herein described.

Figure 9:
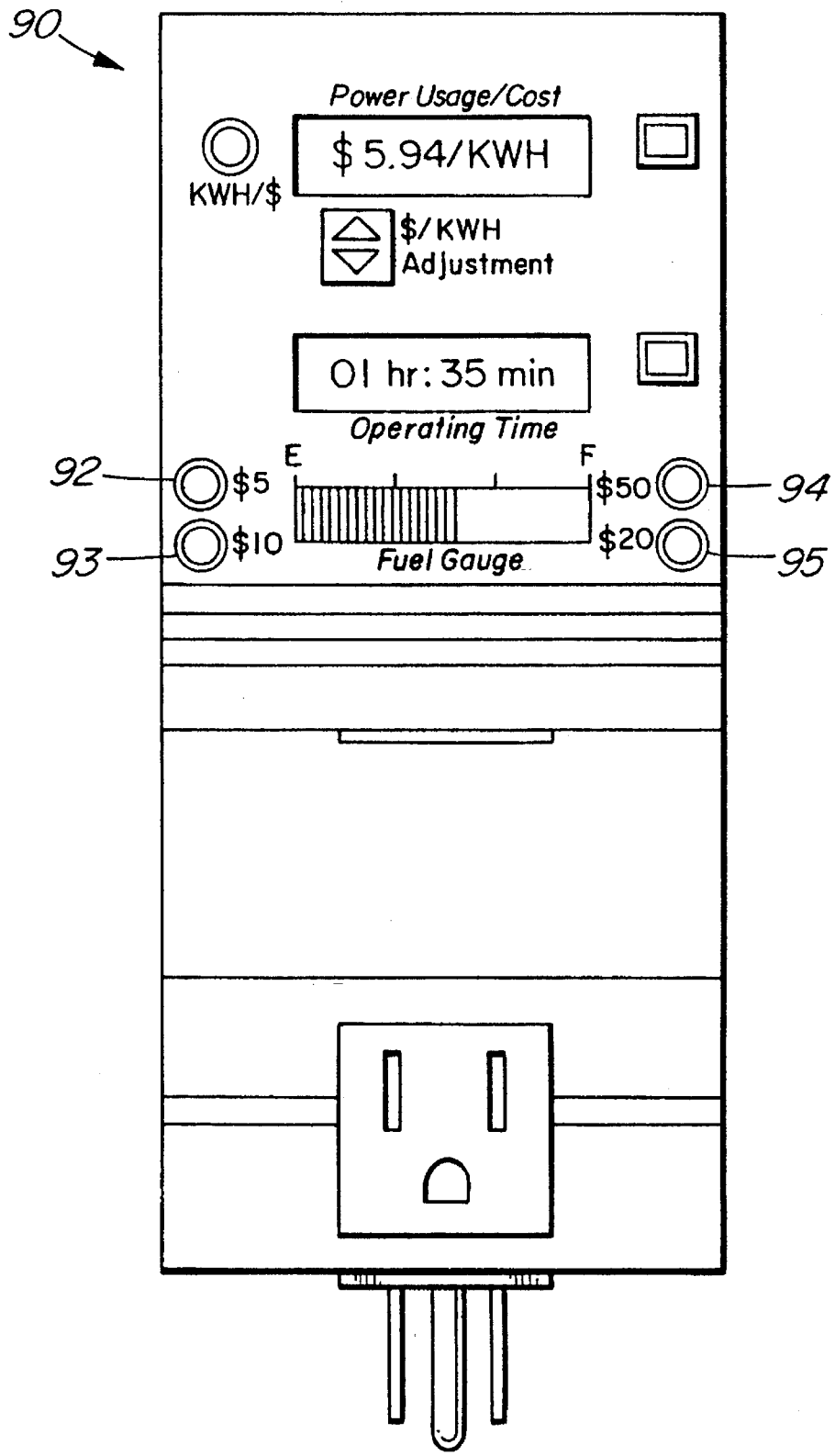
FIG. 9 is a front view of the power meter illustrating a banking or "fuel" gauge according to a further aspect of the invention.

A further aspect of the invention is illustrated in FIG. 9 where the power meter is generally shown at 90. In this embodiment, the power meter 90 has a banking or "fuel gauge" 91 which displays the amount remaining of a predetermined monetary amount of electricity to be used. For example, the user may wish to push in push button 92 which will then show the gauge full for a cost of $5.00. When the power consumed is such that $2.50 of the $5.00 is used, the gauge 91 will illustrate the power left and consumed as illustrated in display 91 in FIG. 9. When the total $5.00 is used, the gauge 91 will show zero. Likewise, push buttons 93, 94 and 95 may be used to set up additional costing reference values for the "full" gauge 91 as indicated.

It is contemplated that all of the embodiments may be utilized with an external or internal located computer which would interface with the various units or wall switches. This could be particularly useful in a commercial environment where offices may be shared by different companies. In this event, it is contemplated that the units or wall switches could be installed in each office and the power usage in the respective offices would be monitored from a central location. Similarly, the use of several units or wall switches in a large house would allow central monitoring of several different appliances or areas of the house.

While only preferred embodiments of the invention have been described herein in detail, the invention is not limited thereby and modifications can be made within the scope of the attached claims.

What is claimed is:

1. An electric power meter, comprising:

a body member;

prongs on said body member for insertion into an electric socket;

a second socket on said body member for receiving the plug of an electric appliance, said second socket being in electrical communication with said prongs for transferring electric power from said prongs to said second socket;

current measuring means in said body member for measuring the total accumulated electric current flow between said prongs and said second socket on said body member during actual operation of said electrical appliance;

a timer for measuring the duration of said electric current flow;

processing means associated with said body member for receiving data from said current measuring means to calculate electric power consumed from said data; and display means associated with said body member for displaying measurement results of the power meter thereon; said displayed measurement results comprising electric power consumed and the time period during which the appliance is in actual operation and said power has been so consumed.

2. The power meter according to claim 1, wherein a plurality of said sockets are provided on the body member for receiving the plugs of a plurality of electrical appliances, each of said sockets being connected to said prongs on the body member and further comprising current measuring means for measuring electric current flow between each of said sockets and said prongs and timing means for measuring the duration of said electric current flow between each of said sockets and said prongs on the body member.

3. The power meter according to claim 2, further comprising computer interface means on the body member for downloading the measurement results of the power meter to an external computer for processing the results.

4. The power meter according to claim 1, further comprising data storage means in said body member for storing said measurement results.

5. The power meter according to claim 1, comprising colour-coded lighting means on the body member for respectively indicating relatively higher and relatively lower power consumption conditions.

6. The power meter according to claim 5, wherein said colour-coded lighting means comprises red lighting means, for indicating the relatively higher power consumption condition, and green lighting means for indicating the relatively lower power consumption condition.

7. The power meter according to claim 6, wherein said colour-coded lighting means further comprises lighting means for indicating an intermediate condition between said relatively higher and relatively lower consumption conditions.

8. The power meter according to claim 7, wherein said red lighting means comprises two red LED's adjacent each other, said green lighting means comprises two green LED's adjacent each other and said intermediate lighting means comprises a white LED between said red and said green LED's.

* * * * *